(12) United States Patent
Huang et al.

(10) Patent No.: US 11,394,002 B2
(45) Date of Patent: Jul. 19, 2022

(54) DISPLAY PANEL HAVING COFFERDAM STRUCTURES INCLUDING GRATING STRUCTURES DISPOSED WITHIN CAVITIES THEREOF

(71) Applicant: BOE Technology Group Co., Ltd., Beijing (CN)

(72) Inventors: Haitao Huang, Beijing (CN); Chuanxiang Xu, Beijing (CN); Yong Yu, Beijing (CN); Xiang Li, Beijing (CN); Renquan Gu, Beijing (CN); Yang Yue, Beijing (CN); Shi Shu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 58 days.

(21) Appl. No.: 16/903,679

(22) Filed: Jun. 17, 2020

(65) Prior Publication Data

US 2021/0193949 A1 Jun. 24, 2021

(30) Foreign Application Priority Data

Dec. 18, 2019 (CN) .......................... 201911308310.9

(51) Int. Cl.
*H01L 51/52* (2006.01)
*H01L 27/32* (2006.01)
*H01L 51/56* (2006.01)

(52) U.S. Cl.
CPC ........ *H01L 51/524* (2013.01); *H01L 27/3211* (2013.01); *H01L 51/5253* (2013.01); *H01L 51/5275* (2013.01); *H01L 51/56* (2013.01)

(58) Field of Classification Search
CPC . H01L 51/524; H01L 51/525; H01L 51/5253; H01L 51/5275; H01L 51/5281;
(Continued)

(56) References Cited

U.S. PATENT DOCUMENTS

2012/0218173 A1* 8/2012 Ohta .................. G02B 27/1046
345/76
2017/0271554 A1 9/2017 Coe-Sullivan et al.
(Continued)

FOREIGN PATENT DOCUMENTS

| CN | 106773256 A | 5/2017 |
| CN | 109285864 A | 1/2019 |
| CN | 110444691 A | 11/2019 |

OTHER PUBLICATIONS

Office Action for corresponding Chinese Application 201910678617.1 dated Sep. 27, 2021.
(Continued)

*Primary Examiner* — Matthew E. Gordon
(74) *Attorney, Agent, or Firm* — ArentFox Schiff LLP; Michael Fainberg

(57) ABSTRACT

The present disclosure provides a display panel, a method for preparing the display panel and a display device. The display panel includes a driving back plate; a light-emitting structure array, arranged on the driving back plate and includes light-emitting structures in one-to-one correspondence to sub-pixels; cofferdam structures, configured to form cavities in one-to-one correspondence to the light-emitting structures; where each cofferdam structure is arranged between respective one pair of two adjacent light-emitting structures, and the each cofferdam structure includes a lyophobic material layer; and a micro lens array, including micro lenses in one-to-one correspondence to the cavities; where the micro lens array is arranged on a side, facing away from the driving back plate, of the light-emitting structure array, each micro lens is arranged in a corresponding cavity and arranged at a corresponding lyophobic material layer, and a material of the micro lenses includes a solidified liquid material.

13 Claims, 4 Drawing Sheets

(58) Field of Classification Search
CPC ... H01L 51/5284; H01L 51/56; H01L 27/3211
USPC .......................................................... 257/40
See application file for complete search history.

(56) References Cited

U.S. PATENT DOCUMENTS

2018/0190673 A1    7/2018  Wang et al.
2020/0066804 A1*   2/2020  Jung ................... H01L 51/5284

OTHER PUBLICATIONS

Office Action for corresponding Chinese Application 201911308310.9 dated Sep. 9, 2021.

* cited by examiner

DISPLAY PANEL HAVING COFFERDAM STRUCTURES INCLUDING GRATING STRUCTURES DISPOSED WITHIN CAVITIES THEREOF

CROSS-REFERENCE TO RELATED APPLICATION

This application claims priority to Chinese Patent Application No. 201911308310.9, filed Dec. 18, 2019, the content of which is incorporated by reference in its entirety.

FIELD

The present disclosure relates to the field of display, in particular to a display panel, a method for preparing the display panel and a display device.

BACKGROUND

At present, micro diode light-emitting display products are increasingly high in share in small-size products, mainly comprise Micro-OLEDs and Micro-LEDs, have the characteristics of being light, thin, small in size, easy to carry and the like, and are favored by the display field of virtual reality (AR).

The AR field has high requirements for luminance of light emitted at a front viewing angle from display products, and therefore, Micro-Lens arrays are generally used to improve the luminance of light emitted at the front viewing angle.

SUMMARY

Embodiments of the present disclosure provide a display panel, a method for preparing the display panel and a display device.

In a first aspect, the embodiments of the present disclosure provide a display panel. The display panel includes: a driving back plate; a light-emitting structure array, arranged on the driving back plate and includes a plurality of light-emitting structures in one-to-one correspondence to a plurality of sub-pixels; a plurality of cofferdam structures, configured to form a plurality of cavities in one-to-one correspondence to the plurality of light-emitting structures; where the plurality of cofferdam structures each is arranged between respective one pair of two adjacent light-emitting structures, and the plurality of cofferdam structures each includes a lyophobic material layer; and a micro lens array, including a plurality of micro lenses in one-to-one correspondence to the plurality of cavities; where the micro lens array is arranged on a side, facing away from the driving back plate, of the light-emitting structure array, each of the plurality of micro lenses is arranged in a corresponding cavity and arranged at a corresponding lyophobic material layer; and a material of the micro lenses includes a solidified liquid material.

In some embodiments, the plurality of light-emitting structures are organic light emitting diode (OLED) devices; and the plurality of cofferdam structures are arranged on a side, facing away from the driving back plate, of the light-emitting structure array.

In some embodiments, the plurality of light-emitting structures are white-light OLED devices; and the display panel further includes: a grating structure array, including a plurality of grating structures in one-to-one correspondence to the plurality of cavities, where each of the plurality of grating structures is arranged in a corresponding cavity; the plurality of grating structures are classified into various types of grating structures which are corresponding to the plurality of sub-pixels in various color, respectively, and each type of the grating structure is configured to diffract light and take out light waves of which wavelengths are the same as light exiting wavelength of a corresponding sub-pixel.

In some embodiments, the grating structure array includes first grating structures, corresponding to red sub-pixels, second grating structures corresponding to green sub-pixels, and third grating structures corresponding blue sub-pixels; and a first period of the first grating structures ranges from 630 nm to 670 nm, a second period of the second grating structures ranges from 500 nm to 540 nm, and a third period of the third grating structures ranges from 400 nm to 440 nm.

In some embodiments, the plurality of grating structures each includes a first layer of metal grating and a second layer of metal grating, and the first layer of metal grating and the second layer of metal grating are alternately arranged.

In some embodiments, the plurality of light-emitting structures are micro LED devices; and each of the plurality of light-emitting structures is arranged in a corresponding cavity.

In some embodiments, the light-emitting structure array includes a plurality of micro LED devices in various colors corresponding to the plurality of sub-pixels in various colors, respectively; and the display panel further includes: a protecting layer, including a plurality of protecting structures in one-to-one correspondence to the plurality of cavities, and each of the plurality of protecting structures is arranged in the corresponding cavity and is arranged between a corresponding light-emitting structure and a corresponding micro lens.

In some embodiments, a longitudinal section of the each of the plurality of cofferdam structures is inverted trapezoidal.

In some embodiments, a material of lyophobic material layer is an organic material.

In some embodiments, the plurality of cofferdam structures each is a single-layer structure; alternatively, the plurality of cofferdam structures each is a double-layer structure with a layer far away from the driving back plate being the lyophobic material layer.

In some embodiments, the material of the micro lenses is a photocurable material.

In a second aspect, the embodiments of the disclosure provide a method for preparing a display panel. The method includes: arranging a light-emitting structure array and a plurality of cofferdam structures on a driving back plate, where the light-emitting structure array includes a plurality of light-emitting structures in one-to-one correspondence to a plurality of sub-pixels; and the plurality of cofferdam structures are configured to form a plurality of cavities in one-to-one correspondence to the plurality of light-emitting structures; where the plurality of cofferdam structures each is arranged between respective one pair of two adjacent light-emitting structures, and the plurality of cofferdam structures include a lyophobic material layer; and preparing a micro lens array on the driving back plate, where the micro lens array includes a plurality of micro lenses in one-to-one correspondence to a plurality of cavities, and the plurality of micro lenses each is arranged in a corresponding cavity and arranged at a corresponding lyophobic material layer; and a material of the micro lenses includes a solidified liquid material.

In some embodiments, in the method above according to the embodiments of the disclosure, the preparing the micro lens array on the driving back plate includes: printing a micro lens material into each of the plurality of cavities by an ink-jet printing process, and forming the plurality of micro lenses distributed in an array manner.

In some embodiments, in the method above according to the embodiments of the disclosure, the method further includes: preparing a white-light OLED device array on the driving back plate; preparing a encapsulation layer on the white-light OLED device array; and preparing a grating structure array and the plurality of cofferdam structures on the encapsulation layer; where the grating structure array includes a plurality of grating structures in one-to-one correspondence to the plurality of cavities, and each of the plurality of grating structures is arranged in a corresponding cavity; and the plurality of grating structures are classified ino various types grating structures which are corresponding to the plurality of sub-pixels in various colors, respectively, and each type of the grating structure is configured to diffract light and take out light waves of which wavelengths are the same as light exiting wavelengths of a corresponding sub-pixel.

In some embodiments, in the method above according to the embodiments of the disclosure, the method further includes: preparing the plurality of cofferdam structures on the driving back plate; transferring a plurality of micro LED devices in various colors corresponding to the plurality of sub-pixels in various colors to the driving back plate through a mass transfer technology, respectively, where the plurality of micro LED devices each is arranged in a corresponding cavity; and preparing a protecting layer on the each of the plurality of micro LED devices, where the protecting layer includes a plurality of protecting structures in one-to-one correspondence to the plurality of cavities, and the plurality of protecting structures each is arranged in the corresponding cavity.

In a third aspect, the embodiments of the disclosure provide a display device includes any one of the display panels.

DETAILED DESCRIPTION OF THE EMBODIMENTS

The technical solutions in the embodiments of the present disclosure will be clearly and completely described below with reference to the drawings in the embodiments of the present disclosure. It is obvious that the described embodiments are only a part of the embodiments of the present disclosure, and not all of the embodiments. All other embodiments, which can be obtained by a person skilled in the art without making any creative effort based on the embodiments in the present disclosure, belong to the protection scope of the present disclosure.

Figure 1A:
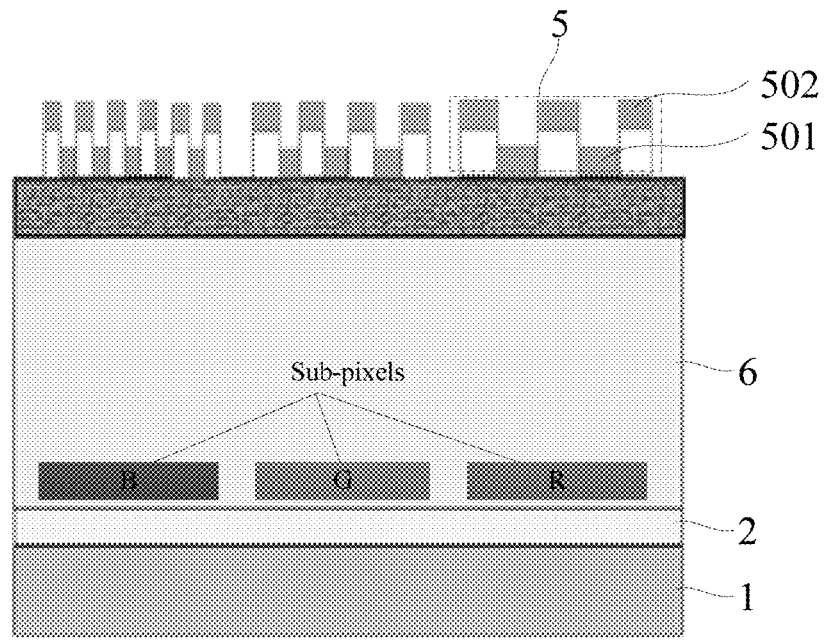
FIG. 1A is a schematic diagram of a section structure of a display panel according to an embodiment of the present disclosure after a grating structure array is prepared and formed.
Figure 1B:
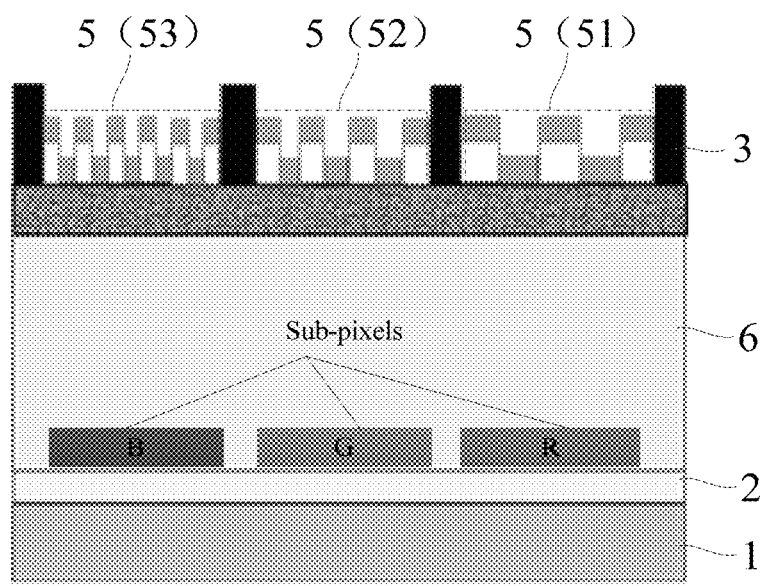
FIG. 1B is a schematic diagram of a section structure of the display panel in FIG. 1A after cofferdam structures are prepared and formed.
Figure 1C:
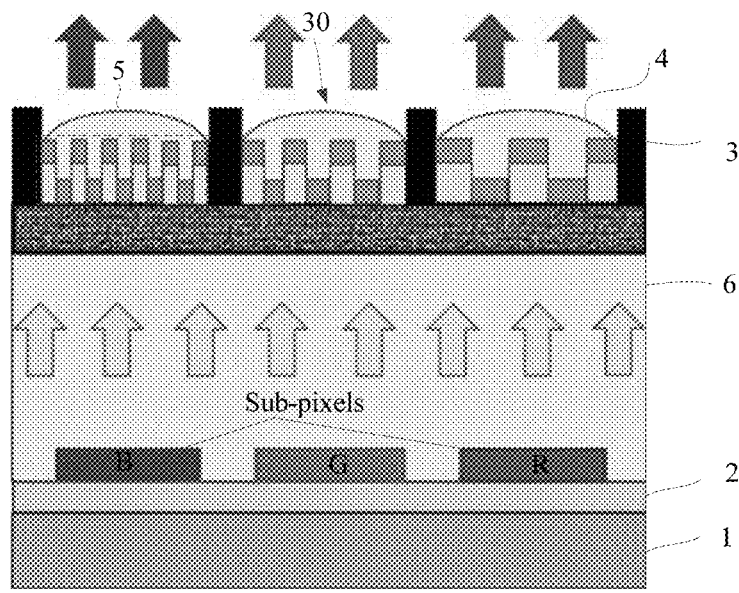
FIG. 1C is a schematic diagram of a section structure of the display panel in FIG. 1B after a micro lens array is prepared and formed.
Figure 3A:
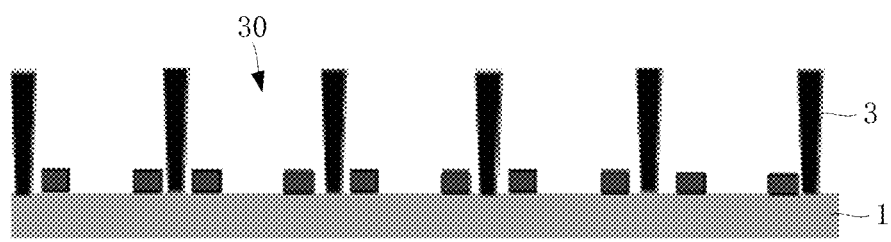
FIG. 3A is a schematic diagram of a section structure of a display panel according to another embodiment of the present disclosure after cofferdam structures are prepared and formed.
Figure 3B:
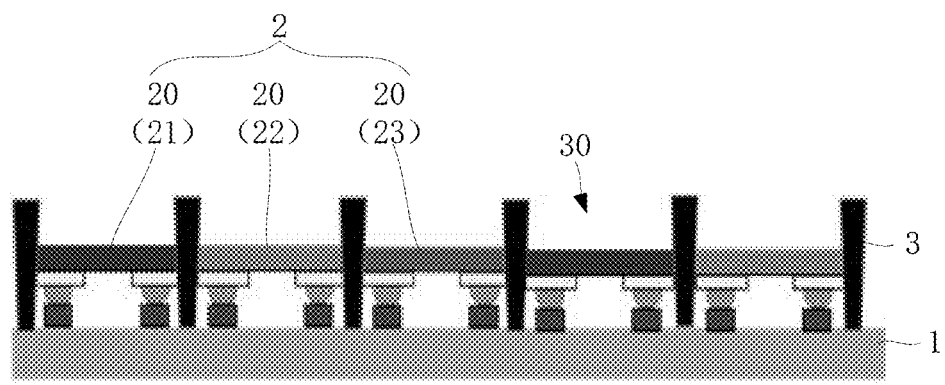
FIG. 3B is a schematic diagram of a section structure of the display panel in FIG. 3A after mass transfer of Micro LED devices is completed.
Figure 3C:
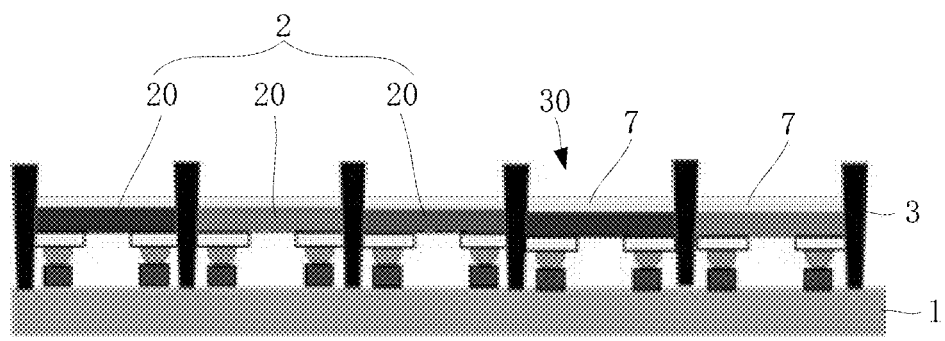
FIG. 3C is a schematic diagram of a section structure of the display panel in FIG. 3B after a protecting layer is prepared and formed.
Figure 3D:
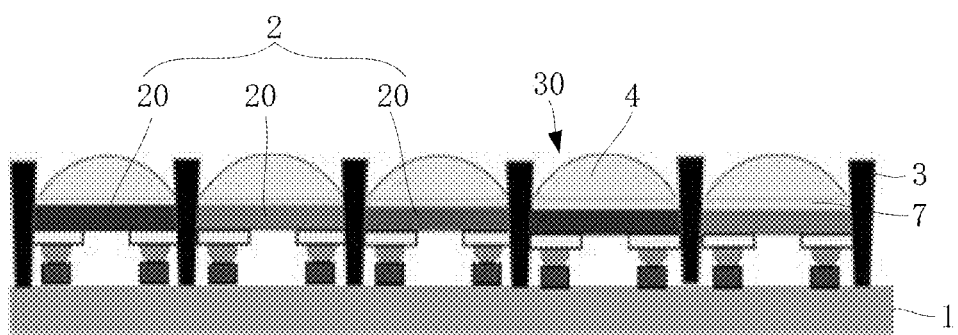
FIG. 3D is a schematic diagram of a section structure of the display panel in FIG. 3C after a micro lens array is prepared and formed.

As shown in FIG. 1C and FIG. 3D, some embodiments of the present disclosure provide a display panel. The display panel includes: a driving back plate 1, a light-emitting structure array 2, a plurality of cofferdam structures 3 and a micro lens array.

In some embodiments, the light-emitting structure array 2 is arranged on the driving back plate 1 and includes a plurality of light-emitting structures 20 in one-to-one correspondence to a plurality of sub-pixels.

The plurality of cofferdam structures 3 are configured to form a plurality of cavities 30 in one-to-one correspondence to the plurality of light-emitting structures 20. Each of the plurality of cofferdam structures 3 is arranged between respective one pair of two adjacent light-emitting structures 20. Each of the plurality of cofferdam structures 3 includes a lyophobic material layer.

The micro lens array includes a plurality of micro lenses 4 in one-to-one correspondence to the plurality of cavities 30. The micro lens array is arranged on a side, which is far away from the driving back plate 1, of the light-emitting structure array 2. Each of the plurality of micro lenses 4 is arranged in a corresponding cavity 30, and is arranged at a corresponding lyophobic material layer. Each of the plurality of micro lenses 4 includes a solidified liquid material.

In some embodiments, the solidified liquid material refers to a solid material obtained after solidification of liquid.

In the above display panel, the micro lens array is arranged on the side, which is far away from the driving back plate 1, of the light-emitting structure array 2, the plurality of micro lenses 4 in the micro lens array are in one-to-one correspondence to the plurality of light-emitting structures 20, and the luminance of light emitted at a front viewing angle from the display panel may be improved effectively, so that the display panel can be applied to the display field such as AR with high requirement on the luminance of the light emitted at the front viewing angle.

Moreover, the plurality of cofferdam structures 3 are further arranged in the display panel, and form a plurality of cavities 30 in one-to-one correspondence to the plurality of light-emitting structures, and each of the plurality of cofferdam structures 3 is arranged between respective one pair of two adjacent light-emitting structures, and each of the plurality of micro lenses 4 is arranged in a corresponding cavity 30.

Because each of the plurality of micro lenses 4 includes a solidified liquid material, the micro lenses are generally prepared by processes such as ink-jet printing or coating, each of the plurality of cofferdam structures 3 includes a lyophobic material layer, namely, part of side walls of the plurality of cavities 30 have lyophobicity and have repulsion action on liquid, furthermore, when the liquid material of each of the plurality of micro lenses 4 is arranged at the lyophobic material layers in the plurality of cavities 30 through processes such as ink-jet printing or coating, the liquid material can automatically form a convex lens shape under the repulsion action of the side walls of the plurality of cavities 30, the liquid material may directly form a convex lens structure after being cured, and the preparation process is very simple.

In summary, the display panel provided by the embodiments of the present disclosure is high in luminance of light emitted at the front viewing angle, and can be applied to the display field such as AR, the process for preparing the display panel is quite low in difficulty, the preparation process is simple, and the cost is low.

Figure 4:
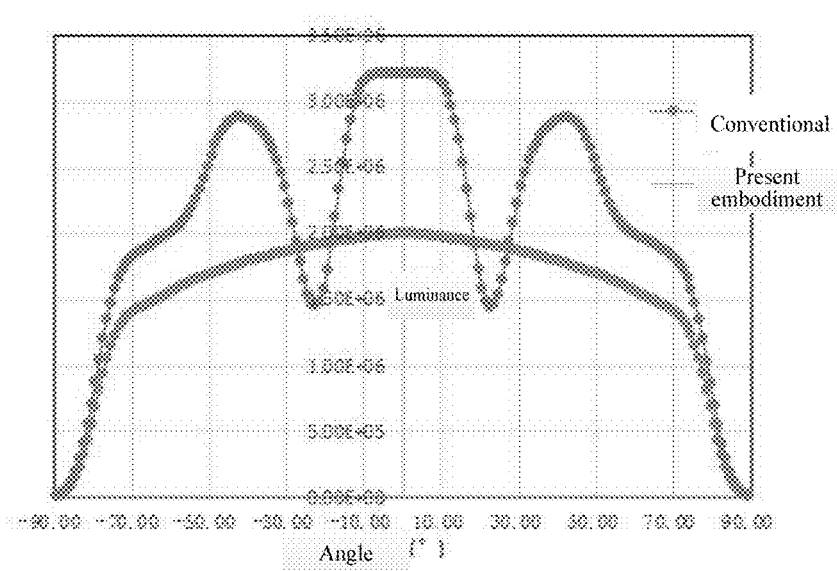
FIG. 4 is a schematic diagram illustrating a comparison between a curve of the luminance of the light emitted from a display panel and a curve of the luminance of the light emitted from a conventional display panel along variation of a light emergent angle according to an embodiment of the present disclosure.

In some embodiments, FIG. 4 is a variation curve of the luminance of the light emitted from the display panel along with the light emergent angle obtained through experimental analysis. The two variation curves are from a conventional display panel (conventional) without cofferdam structures or a micro lens array and a display panel (the present embodiment) with the plurality of cofferdam structures and the micro lens array provided in the embodiments of the present disclosure.

As can be seen by comparing the two curves in the figure, the value of the luminance of emitted light of the variation curve in the present embodiments is approximately 1.6 times the value of luminance of emitted light of the conventional variation curve between an emergent angle of minus 10 degrees and an emergent angle of 10 degrees, and thus, compared with the conventional display panel, the display panel with the plurality of cofferdam structures and the micro lens array provided by the embodiments of the present disclosure have the feature that the central luminance of the display panel can be increased by 1.6 times.

In some embodiments, in the display panel provided by the embodiments of the present disclosure, the plurality of micro lenses can be made from a photocurable material, and can be prepared through an ink-jet printing or coating process, for example, similar NOA73 solution, SU-8 or a transparent acrylic acid resin material can be used, of course, the solidified liquid includes but is not limited to the photocurable material.

In some embodiments, the lyophobic material layer in each of the plurality of cofferdam structures is an organic material. Exemplarily, the material of the each of the plurality of cofferdam structures can be a hydrophobic material such as an acrylic acid resin material. Further, the plurality of cofferdam structures can also be made from a black acrylic acid resin material, the reflected light of the display panel is reduced favorably, of course, the plurality of cofferdam structures can also be made from a white or gray material.

In some embodiments, each of the plurality of cofferdam structures can be of a single-layer structure, namely, the whole cofferdam structure is made from a lyophobic material. Alternatively, each of the plurality of cofferdam structures can also be of a double-layer structure, and the layer which is far away from the driving back plate is a lyophobic material layer. The surface of the upper portion of each of the plurality of cofferdam structures has lyophobicity, and a micro lens material can be conveniently printed into the plurality of cavities subsequently; and meanwhile, due to the repulsion action of the lyophobic material layer, the upper surface of a micro lens solution in each of the plurality of cavities can be arc-shaped, and thus, a micro lens shape is formed.

In some embodiments, the driving back plate may include a substrate as well as a buffer layer, a low-temperature polycrystalline silicon layer, a gate insulation layer, a gate layer, an interlayer insulation layer, a source and drain metal layer, a planar layer, a pixel electrode layer, a pixel defining layer, a spacer layer and the like which are formed on the substrate.

In some embodiments, as shown in FIG. 1A to FIG. 1C, in the display panel provided by the embodiments of the present disclosure, the plurality of light-emitting structures may be OLED devices; and the plurality of cofferdam structures 3 are arranged on a side, which is far away from the driving back plate 1, of the light-emitting structure array 2, and further, a encapsulation layer 6 may further be arranged between the light-emitting structure array 2 and the plurality of cofferdam structures 3.

In some embodiments, the plurality of light-emitting structures may be white-light OLED devices, at the moment, the display panel provided by the embodiments of the present disclosure may further include a grating structure array, the grating structure array includes a plurality of grating structures 5 in one-to-one correspondence to the plurality of cavities 30, and each of the plurality of grating structures 5 is arranged in a corresponding cavity 30; and the plurality of grating structures are classified into various type of grating structures which are corresponding to the plurality of sub-pixels in various colors, respectively, each type of the plurality of grating structure is configured to diffract light and take out light waves of which wavelengths are the same as light exiting wavelengths of a corresponding sub-pixel, namely, the various grating structures are equivalent to light filter films in various colors, and may have a filtering effect.

In some embodiments, as shown in FIG. 1B, the grating structure array includes first grating structures 51 corresponding to red sub-pixels, second grating structures 52 corresponding to green sub-pixels, and third grating structures 53 corresponding to blue sub-pixels. A first period of the first grating structures 51 ranges from 630 nm-670 nm. A second period of the second grating structures 52 ranges from 500 nm-540 nm. A third period of the third grating structures 53 ranges from 400 nm-440 nm. The first grating structures 51 may take out red light, which is equivalent to a red film. The second grating structures 52 may take out green light, which is equivalent to a green film. The third grating structures 53 may take out blue light, which is equivalent to a blue film.

In some embodiments, the first period of the first grating structures 51 may be 650 nm, the second period of the second grating structures 52 may be 520 nm, and the third period of the third grating structures 53 may be 420 nm.

In some embodiments, as shown in FIG. 1A, the grating structure array includes two layers of metal gratings, namely, each of the plurality of grating structures 5 includes two layers of structures including a first layer of metal grating 501 and a second layer of metal grating 502, and in some embodiments, the first layer of metal grating 501 and the second layer of metal grating 502 are arranged alternately. In some embodiments, the material of the metal gratings includes but is not limited to aluminum, and the height of the double layers of metal gratings ranges from 50 nm to 200 nm.

In some embodiments, the two layers of metal gratings are of nano structures, the double-layer nano metal grating structure not only has the effect of a color filter, but also has the effect of a polaroid, reflected light of the display panel can be reduced, moreover, because two layers of structures including a polaroid and a color film layer are replaced simultaneously, the thickness of the whole display product can further be reduced.

Switching of the double-layer nano metal grating structure to the color of diffracted light waves can be explained by a surface plasmon resonance effect. In some embodiments, incident light irradiates the surface of the metal gratings to generate a diffraction phenomenon, at the moment, diffracted waves with different energy levels appear, and moreover, different diffracted waves are separated according to different diffraction angles. An SPR phenomenon occurs if the wave vector of the light wave of a certain diffraction order can be matched with the wave vector of a plasma wave (SPW). When SPR of the nano metal gratings is excited, the following formula is satisfied:

$$k_0 \sin\theta + n2\pi/T = k_{sp} = k_0\sqrt{\varepsilon_m n_a^2/\varepsilon_m + n_a^2}.$$

$k_0$ refers to the wave number in vacuum, $\theta$ is an incident angle of TM polarized light, $n_a$ is the refractive index of an adjacent material which is in contact with the gratings, T is a grating period, $k_{sp}$ is the wave number of surface plasma wave, and $\varepsilon_m$ is a dielectric constant of metal under Lorantz-Drudem model.

From the above formula, it can be known that color filtering with adjustable color may be realized by changing the period T of the nano metal gratings and the refractive index $n_a$ of the adjacent material. The nano metal gratings may be subjected to simulation design by using a rigorous coupled-wave analysis (RCWA) method, and the resonance wavelength of the nano metal gratings may be changed by changing the refractive index of a metal adjacent substance in the double-layer nano metal grating structure based on a specific period, so that color switching is realized.

In some embodiments, in the display panel provided by the embodiment of the present disclosure, the color filter and the polaroid may also adopted to replace the grating structure array, namely, a lamination design including the white-light OLED device array, the color filter, the polaroid and the micro lens array is adopted, the display principle of the lamination structure is the same as the display principle of the embodiment, and it is not described in detail herein.

In some embodiments, as shown in FIG. 3A to FIG. 3D, the plurality of light-emitting structures 20 may be micro LED devices; and in the light-emitting structure array 2, each of the plurality of light-emitting structures 20 is arranged in the corresponding cavity 30.

In some embodiments, the light-emitting structure array 2 includes a plurality of Micro LED devices corresponding to the plurality of sub-pixels in various colors, respectively; and exemplarily, as shown in FIG. 3B, the light-emitting structure array 2 includes a red light Micro LED device 21 corresponding to the red sub-pixel, a green light Micro LED device 22 corresponding to the green sub-pixel and a blue light Micro LED device 23 corresponding to the blue sub-pixel.

Further, as shown in FIG. 3C and FIG. 3D, the display panel in the embodiments of the present disclosure may further includes a protecting layer, the protecting layer includes a plurality of protecting structures 7 in one-to-one correspondence to the plurality of cavities 30, and each of the plurality of protecting structures 7 is arranged in the corresponding cavity 30, and is arranged between a corresponding light-emitting structure 20 and a corresponding micro lens 4.

In some embodiments, the protecting layer may be of an inorganic film and organic film alternate stacking structure.

In some embodiments, the longitudinal section of each of the plurality of cofferdam structures 3 may be inverted trapezoidal. The longitudinal section of each of the plurality of cofferdam structures 3 is inverted trapezoidal, so that the opening area of each of the plurality of cavities 30 may be smaller than the cross section area of the inside, and the plurality of Micro LED devices of the inside are fixed favorably.

The embodiments of the present disclosure further provide a display device, and the display device includes any one of the display panels.

In some embodiments, the display device is high in luminance of light emitted at the front viewing angle, moreover, the preparation process is quite low in difficulty, and the display device may be applied to AR products with high requirements on luminance.

Based on the same inventive concept, an embodiment of the present disclosure further provides a method for preparing a display panel.

Figure 5:
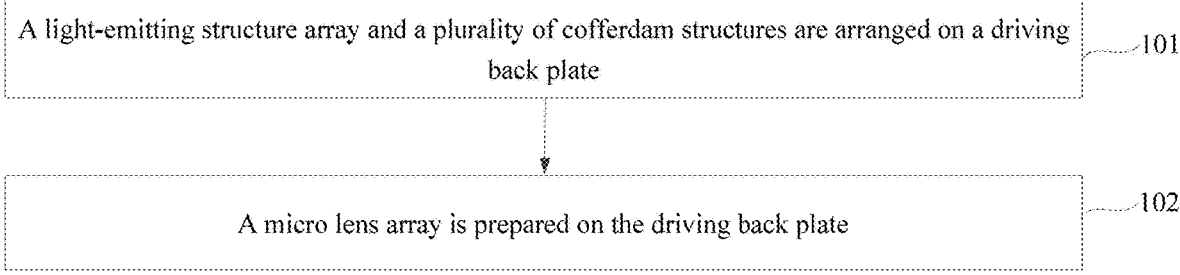
FIG. 5 is a flowchart of a method for preparing a display panel according to an embodiment of the present disclosure.

As shown in FIG. 5, the method includes the following steps.

Step 101, a light-emitting structure array and a plurality of cofferdam structures are arranged on a driving back plate. The light-emitting structure array includes a plurality of light-emitting structures in one-to-one correspondence to a plurality of sub-pixels. The plurality of cofferdam structures are configured to form a plurality of cavities in one-to-one correspondence to the plurality of light-emitting structures. Each of the plurality of cofferdam structures is arranged between respective one pair of two adjacent light-emitting structures. Each of the plurality of cofferdam structures includes a lyophobic material layer.

Step 102, a micro lens array is prepared on the driving back plate. The micro lens array includes a plurality of micro lenses in one-to-one correspondence to the plurality of cavities. Each of the plurality of micro lenses is arranged in a corresponding cavity and is arranged at a corresponding lyophobic material layer. A material of the each of the plurality of micro lenses includes a solidified liquid material.

In some embodiments, the step 102 of preparing the micro lens array on the driving back plate includes: as shown in FIG. 1C and FIG. 3D, printing a micro lens material into the plurality cavities 30 by using an ink-jet printing process and forming the plurality of micro lenses 4 distributed in an array manner.

In some embodiments, the step 101 of arranging the light-emitting structure array and the plurality of cofferdam structures on a driving back plate includes: as shown in FIG. 1A and FIG. 1B, preparing a white-light OLED device array (namely the light-emitting structure array 2) on the driving back plate 1; preparing a encapsulation layer 6 on the white-light OLED device array; and preparing a grating structure array (including a plurality of grating structures 5 arranged in an array manner) and the plurality of cofferdam structures 3 on the encapsulation layer 6.

The grating structure array includes the plurality of grating structures 5 in one-to-one correspondence to the plurality of cavities 30, and each of the plurality of grating structures 5 is arranged in the corresponding cavity 30; and the plurality of grating structures are classified into various of type grating structures (such as a first grating structure 51, a second grating structure 52 and a third grating structure 53 in FIG. 1B) which are corresponding to the plurality of sub-pixels in various colors, respectively, and each type of the plurality of grating structures is configured to diffract light and take out light waves of which wavelengths are the same as light exiting wavelengths of a corresponding sub-pixel.

In some embodiments, as shown in FIG. 1A, the grating structure array includes two layers of metal gratings, namely each of the plurality of grating structures 5 includes two layers of structures including a first layer of metal grating 501 and a second layer of metal grating 502, and in some embodiments, the first layer of metal grating 501 and the second layer of metal grating 502 are alternately arranged. In some embodiments, the material of the metal gratings includes but is not limited to aluminum, and the height of the double layers of metal gratings ranges from 50 nm to 200 nm.

Figure 2:
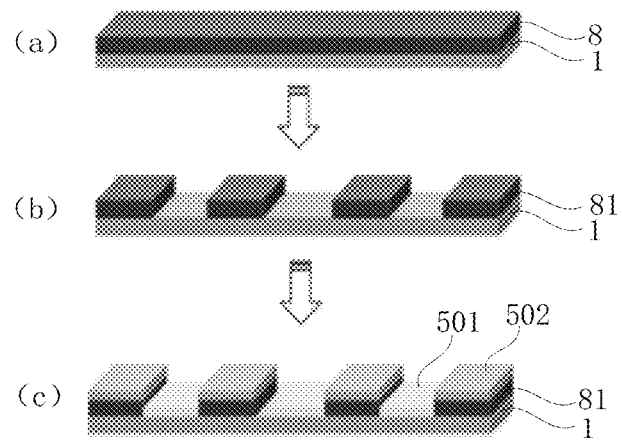
FIG. 2 is a schematic diagram of a process for preparing a grating structure array provided by an embodiment of the present disclosure.

In some embodiments, the grating structure array may be prepared through a patterning process, and the patterning process may include the steps of photoresist spin-coating, drying, exposing, etching and the like. Exemplarily, a preparation process of the grating structure array may specifically include the following steps: as shown in FIG. 2, (a) preparing a photoresist layer 8 on the driving back plate 1 (other structures arranged on the driving back plate 1 are not shown in FIG. 2); (b) forming a plurality of grating patterns 81 which are the same as the second layer of metal grating through a laser interference exposure process; and (c) depositing a metal material on the plurality of grating patterns 81 through an electron beam evaporation process, where the deposition thickness of the metal material is smaller than the thickness of the photoresist layer, so that, the second layer of metal grating 502 is formed on each of the plurality of grating patterns 81 of photoresist, and the first layer of metal grating 501 is formed between any two adjacent grating patterns 81 of the photoresist.

In some embodiments, the step 101 of arranging the light-emitting structure array and the plurality of cofferdam structures on a driving back plate includes: as shown in FIG. 3A, preparing the plurality of cofferdam structures 3 on the driving back plate 1, where the plurality of cofferdam structures form a plurality of cavities 30; as shown in FIG. 3B, transferring a plurality of micro LED devices in various colors (such as the red light Micro LED device 21, the green light Micro LED device 22 and the blue light Micro LED device 23 in FIG. 3B) corresponding to the plurality of sub-pixels in various colors to the driving back plate 1 through a mass transfer technology, respectively, where each of the plurality of micro LED devices is arranged in the corresponding cavity 30; and as shown in FIG. 3C, preparing a protecting layer on the each of the plurality of micro LED devices, where the protecting layer includes a plurality of protecting structures 7 in one-to-one correspondence to the plurality of cavities 30, and each of the plurality of protecting structures 7 is arranged in the corresponding cavity 30.

In some embodiments, before mass transfer of the plurality of Micro LED devices, a process of preparing a Micro LED chip is also included, and preparation of the Micro LED chip is a mature technology at present and is not described herein again; and in addition, the mass transfer technology for the chip includes a van der waals force transfer technology, a laser or optical transfer technology, an electrostatic/electromagnetic force adsorption transfer technology, fluid assembly and the like, and in the embodiments of the present disclosure, the mass transfer method may be specifically selected according to requirements, and is not limited herein.

It will be apparent to those skilled in the art that various changes and modifications may be made in the embodiments of the present disclosure without departing from the spirit and scope of the present disclosure. Thus, if such modifications and variations of the present disclosure fall within the scope of the claims of the present disclosure and their equivalents, the present disclosure is also intended to include such modifications and variations.

What is claimed is:

1. A display panel, comprising:
a driving back plate;
a light-emitting structure array, arranged on the driving back plate and comprising a plurality of light-emitting structures in one-to-one correspondence to a plurality of sub-pixels;
a plurality of cofferdam structures, configured to form a plurality of cavities in one-to-one correspondence to the plurality of light-emitting structures; wherein an orthographic projection, on the driving back plate, of each of the plurality of cofferdam structures is arranged between orthographic projections, on the driving back plate, of respective one pair of two adjacent light-emitting structures, and the plurality of cofferdam structures each comprises a lyophobic material layer; and
a micro lens array, comprising a plurality of micro lenses in one-to-one correspondence to the plurality of cavities; wherein the micro lens array is arranged on a side, facing away from the driving back plate, of the light-emitting structure array, each of the plurality of micro lenses is arranged in a corresponding cavity and arranged at a corresponding lyophobic material layer, and a material of the micro lenses comprises a solidified liquid material;
wherein the plurality of cofferdam structures are arranged on the side, facing away from the driving back plate, of the light-emitting structure array;
wherein the plurality of light-emitting structures are white-light organic light emitting diode (OLED) devices; and
the display panel further comprises:
a grating structure array, comprising a plurality of grating structures in one-to-one correspondence to the plurality of cavities;
wherein each of the plurality of grating structures is arranged in a corresponding cavity; the plurality of grating structures are classified into various types of grating structures which are corresponding to the plurality of sub-pixels in various colors, respectively; and each type of the grating structure is configured to diffract light and take out light waves of which wavelengths are the same as light exiting wavelengths of a corresponding sub-pixel.

2. The display panel according to claim 1, wherein the grating structure array comprises first grating structures corresponding to red sub-pixels, second grating structures corresponding to green sub-pixels and third grating structures corresponding to blue sub-pixels; and
a first period of the first grating structures ranges from 630 nm to 670 nm, a second period of the second grating structures ranges from 500 nm to 540 nm, and a third period of the third grating structures ranges from 400 nm to 440 nm.

3. The display panel according to claim 1, wherein the plurality of grating structures each comprises a first layer of metal grating and a second layer of metal grating, and the first layer of metal grating and the second layer of metal grating are alternately arranged.

4. The display panel according to claim 1, wherein a material of the lyophobic material layer is an organic material.

5. The display panel according to claim 1, wherein the plurality of cofferdam structures each is a single-layer structure; or the plurality of cofferdam structures each is a double-layer structure with a layer far away from the driving back plate being the lyophobic material layer.

6. The display panel according to claim 1, wherein the material of the micro lenses is a photocurable material.

7. A method for preparing the display panel according to claim 1, comprising:
   arranging the light-emitting structure array and the plurality of cofferdam structures on the driving back plate; wherein the light-emitting structure array comprises the plurality of light-emitting structures in one-to-one correspondence to the plurality of sub-pixels; and the plurality of cofferdam structures are configured to form the plurality of cavities in one-to-one correspondence to the plurality of light-emitting structures; wherein an orthographic projection, on the driving back plate, of each of the plurality of cofferdam structures is arranged between orthographic projections, on the driving back plate, of respective one pair of two adjacent light-emitting structures, and the plurality of cofferdam structures comprises the lyophobic material layer; and
   preparing the micro lens array on the driving back plate; wherein the micro lens array comprises the plurality of micro lenses in one-to-one correspondence to the plurality of cavities, wherein the plurality of micro lenses each is arranged in a corresponding cavity and arranged at a corresponding lyophobic material layer; and the material of the micro lenses comprises the solidified liquid material.

8. The method according to claim 7, wherein said preparing the micro lens array on the driving back plate comprises:
   printing a micro lens material into each of the plurality of cavities by using an ink-jet printing process; and
   forming the plurality of micro lenses distributed in an array manner.

9. The method according to claim 8, wherein the method further comprises:
   preparing a white-light OLED device array on the driving back plate;
   preparing an encapsulation layer on the white-light OLED device array; and
   preparing the grating structure array and the plurality of cofferdam structures on the encapsulation layer; wherein
   the grating structure array comprises the plurality of grating structures in one-to-one correspondence to the plurality of cavities, and each of the plurality of grating structures is arranged in a corresponding cavity; and the plurality of grating structures are classified into various types of grating structures which are corresponding to the plurality of sub-pixels in various colors, respectively, and each type of the grating structure is configured to diffract light and take out light waves of which wavelengths are the same as light exiting wavelengths of a corresponding sub-pixel.

10. The method according to claim 8, wherein the method further comprises:
    preparing the plurality of cofferdam structures on the driving back plate;
    transferring a plurality of micro LED devices in various colors corresponding to the plurality of sub-pixels in various colors to the driving back plate through a mass transferring technology, respectively, wherein the plurality of micro LED devices each is arranged in a corresponding cavity; and
    preparing a protecting layer on the each of the plurality of micro LED devices, wherein the protecting layer comprises a plurality of protecting structures in one-to-one correspondence to the plurality of cavities, and the plurality of protecting structures each is arranged in the corresponding cavity.

11. A display device, comprising a display panel, wherein the display panel comprises:
    a driving back plate;
    a light-emitting structure array, arranged on the driving back plate and comprising a plurality of light-emitting structures in one-to-one correspondence to a plurality of sub-pixels;
    a plurality of cofferdam structures, configured to form a plurality of cavities in one-to-one correspondence to the plurality of light-emitting structures; wherein an orthographic projection, on the driving back plate, of each of the plurality of cofferdam structures is arranged between orthographic projections, on the driving back plate, of respective one pair of two adjacent light-emitting structures, and the plurality of cofferdam structures each comprises a lyophobic material layer; and
    a micro lens array, comprising a plurality of micro lenses in one-to-one correspondence to the plurality of cavities; wherein the micro lens array is arranged on a side, facing away from the driving back plate, of the light-emitting structure array, each of the plurality of micro lenses is arranged in a corresponding cavity and arranged at a corresponding lyophobic material layer, and a material of the micro lenses comprises a solidified liquid material;
    wherein the plurality of cofferdam structures are arranged on the side, facing away from the driving back plate, of the light-emitting structure array;
    wherein the plurality of light-emitting structures are white-light organic light emitting diode (OLED) devices; and
    the display panel further comprises:
    a grating structure array, comprising a plurality of grating structures in one-to-one correspondence to the plurality of cavities;
    wherein each of the plurality of grating structures is arranged in a corresponding cavity; the plurality of grating structure are classified into various types of grating structures which are corresponding to the plurality of sub-pixels in various colors, respectively; and each type of the grating structure is configured to diffract light and take out light waves of which wavelengths are the same as light exiting wavelengths of a corresponding sub-pixel.

12. The display device according to claim 11, wherein the grating structure array comprises first grating structures corresponding to red sub-pixels, second grating structures corresponding to a green sub-pixels and third grating structures corresponding to blue sub-pixels; and a first period of the first grating structures ranges from 630 nm to 670 nm, a second period of the second grating structures ranges from 500 nm to 540 nm, and a third period of the third grating structures ranges from 400 nm to 440 nm.

13. The display device according to claim 11, wherein the each of the plurality of grating structures comprises a first layer of metal grating and a second layer of metal grating, and the first layer of metal grating and the second layer of metal grating are alternately arranged.

* * * * *